(12) United States Patent
Kim et al.

(10) Patent No.: US 7,362,635 B2
(45) Date of Patent: Apr. 22, 2008

(54) SEMICONDUCTOR MEMORY DEVICE

(75) Inventors: Kyung-Hyun Kim, Hwaseong-si (KR); Jae-Woong Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/499,156

(22) Filed: Aug. 4, 2006

(65) Prior Publication Data

US 2007/0171738 A1  Jul. 26, 2007

(30) Foreign Application Priority Data

Jan. 24, 2006  (KR) .................. 10-2006-0007444

(51) Int. Cl.
*G11C 7/00* (2006.01)
*G11C 8/00* (2006.01)
(52) U.S. Cl. .................. 365/201; 365/189.08; 365/233
(58) Field of Classification Search ................ 365/201, 365/189.08, 233
See application file for complete search history.

(56) References Cited

U.S. PATENT DOCUMENTS

| | | | | |
|---|---|---|---|---|
| 4,802,133 A | * | 1/1989 | Kanuma et al. | 365/201 |
| 5,793,687 A | * | 8/1998 | Deans et al. | 365/201 |
| 6,205,067 B1 | * | 3/2001 | Tsukude | 365/201 |
| 6,404,684 B2 | * | 6/2002 | Arimoto et al. | 365/201 |
| 6,484,294 B1 | * | 11/2002 | Kiyoshige et al. | 365/201 |
| 6,489,819 B1 | * | 12/2002 | Kono et al. | 365/201 |
| 6,707,735 B2 | * | 3/2004 | Makabe et al. | 365/201 |

FOREIGN PATENT DOCUMENTS

| | | |
|---|---|---|
| JP | 2004-079841 | 3/2004 |
| KR | 1020030027317 A | 4/2003 |
| KR | 1020030050744 A | 6/2003 |
| KR | 1020040003562 A | 1/2004 |
| WO | 1020050058873 A | 6/2005 |

* cited by examiner

*Primary Examiner*—Trong Phan
(74) *Attorney, Agent, or Firm*—F. Chau & Assoc., LLC

(57) ABSTRACT

A semiconductor memory device includes a control signal generator for combining command signals applied from an external portion to generate a test signal; a set/reset signal generator for receiving a mode setting signal applied from an external portion in response to the test signal and generating a first set/reset signal when the mode setting signal is a signal that designates an individual set/reset; a test logic portion for storing and then outputting the mode setting signal in response to the test signal; a set/reset master signal generator for receiving the first set/reset signal to output a set/reset master signal for commonly controlling a test mode of internal blocks of the semiconductor memory device; and a test control signal generator for combining an output signal of the test logic portion to generate a plurality of control signals and generating the set/reset master signal as a plurality of test control signals in response to the plurality of control signals.

22 Claims, 13 Drawing Sheets

SEMICONDUCTOR MEMORY DEVICE

CROSS-REFERENCE TO RELATED APPLICATION

This application claims the benefit of Korean Patent Application No. 2006-0007444, filed on Jan. 24, 2006, the disclosure of which is hereby incorporated herein by reference in its entirety.

BACKGROUND OF THE INVENTION

1. Technical Field

The present disclosure relates to a semiconductor memory device and, more particularly, to a test mode semiconductor memory device in which in a test mode of N steps each test item can be individually reset, thereby reducing a test time and providing testing convenience.

2. Discussion of the Related Art

A test for detecting a particular defect in a semiconductor memory device is performed not in a normal mode of the memory but in a particular test mode which can best detect a corresponding defect. To this end, the semiconductor memory device can have a test mode register therein for setting a test mode of the semiconductor memory device.

The test mode register programs and stores various options such as a column address strobe (CAS) latency, a burst type, and a burst length which respectively correspond to a plurality of different test modes. When a command for setting a certain test mode is externally inputted, the test mode register perceives a test mode corresponding to the inputted command and generates a test mode setting signal for making the semiconductor memory device set to the perceived test mode.

A conventional semiconductor memory device is described below with reference to the accompanying drawings.

FIG. 1 is a block diagram illustrating a conventional test mode semiconductor memory device. The test mode semiconductor memory device of FIG. 1 includes a control signal generator 10, a latch 11, a row address latch 12, a column address latch 13, a column decoder 14, a row decoder 15, a memory cell array 16, a sense amplifier 17, an output buffer 18, a pad 19, a set/reset signal generator 20, a test control signal generator 30, and a test logic portion 40.

The control signal generator 10 receives commands from an external portion of the test set up and outputs various control signals to the column decoder 14, the row decoder 15, and the test logic portion 40. The latch 11 receives mode setting signals from the external portion via an address bus and transmits them to the set/reset signal generator 20 and the test logic portion 40. The row address latch 12 and the column address latch 13 receive the mode setting signals A[12:0] from the external portion and transmit them to the row decoder 15 and the column decoder 14, respectively. The column decoder 14 and the row decoder 15 are connected to the memory cell array 16, and an output of the memory cell array 16 is sequentially transmitted to the sense amplifier 17, the output buffer 18, and the pad 19.

The set/reset signal generator 20 receives a test signal TMRS from the control signal generator 10 and mode setting signals MA[12:0] from the latch 11 to output a test MRS reset signal TMRS RESET. The test logic portion 40 receives the mode setting signals MA[12:0] from the latch 11 to output N-bit set signals LS[8:0], where L is 1 to N. The test control signal generator 30 receives the set signals LS[8:0], where L is 1 to N, from the test logic portion 40 and the test MRS reset signal TMRS RESET from the set/reset signal generator 20 to output and apply test control signals TMRS SET0 to TMRS SETM to all item test target blocks of the semiconductor memory device.

Operation of the conventional test mode semiconductor memory device is described below with reference to FIG. 1.

When the control signal generator 10 receives various commands from the external portion to output signals, including a clock signal CLK and a test signal TMRS, for controlling an internal operation of the semiconductor memory device and the latch 11 receives the mode setting signals A[12:0] via an address bus from an external bus and outputs them, the test logic portion 40 receives the clock signal CLK and the test signal TMRS from the control signal generator 10 and a combination of the mode setting signals MA[12:0] from the latch 11 to recognize entry into the test mode, the test logic portion 40 outputs the N-bit set signals LS[8:0], where L is 1 to N, of first to N-th steps MRSes. The set/reset signal generator 20 receives the mode setting signals MA[12:0] from the latch 11 to output the MRS reset signal TMRS RESET according to a combination of the mode setting signals, as defined by the original circuit designer. The test control signal generator 30 receives the first to N-th step set signals LS[8:0], where L is 1 to N, from the test logic portion 40 and decodes them to select a certain test mode MRS unit before outputting the test control signals TMRS SET0 to TMRS SETM of the corresponding items. The test control signals TMRS SET0 to TMRS SETM are individually applied to the row decoder 15, the column decoder 14, the sense amplifier 17, the output buffer 18, and the pad 19, which are internal blocks of the semiconductor memory device, in order to control the set or reset of a test MRS FIG. 2 is a block diagram illustrating the test control signal generator 30 of the conventional test mode semiconductor memory device shown in FIG. 1. The test control signal generator of FIG. 2 includes a plurality of test mode MRS units 30-1 to 30-M.

A combination of the first to N-th step set signals LS[8:0], where L is 1 to N, is applied to an input terminal of each test mode MRS unit 30-I . . . 30-M from the test logic portion 40, and the test MRS reset signal TMRS RESET is applied to a control terminal of each test mode MRS unit 30-I . . . 30-M from the set/reset signal generator 20, so that the test control signals TMRS SET 0 to TMRS SET M are outputted from an output terminal of each test mode MRS unit 30-I . . . 30-M. That is, a combination of zero-th bits 1S[0] to NS[0] of the first to N-th set signals LS[8:0], where L is 1 to N, is applied to the input terminal of the first test mode MRS unit 30-1, and in the same way a combination of 8-th bits 1S[8] to NS[8] of the first to N-th set signals LS[8:0], where L is 1 to N, is applied to the input terminal of the M-th test mode MRS unit 30-M. Here, M is a number of cases of 512, which is 2 to the 9th power and which is a combination of the 9-bit mode setting signals MA[12:8] and MA[3:0] except for bits MA[7:4], for a safety key for entering the test mode. But, it is possible to make a number of cases of 2 to a higher power by increasing the bit number of the mode setting signals according to a need of the circuit designer.

First, the test MRS reset signal TMRS RESET from the test logic portion 40 is applied to the control terminal of the first test mode MRS unit 30-1, so that the first test control signal TMRS RESET 0 is outputted from the output terminal of the first test mode MRS unit 30-1 by a combination of the zero-th bits 1S[0] to NS[0] of the first to N-th step set signals LS[8:0], where L is 1 to N, and control of the test MRS reset signal TMRS RESET. In the same way, the test MRS reset signal TMRS RESET is commonly applied to the control terminal of the second to M-th test mode MRS units 30-2 to 30-M from the set/reset signal generator 20, so that the second to M-th test control signal TMRS RESET 1 to TMRS RESET M are outputted from the output terminal of the second to M-th test mode MRS unit 30-2 to 30-M by a combination of the first to eighth bits of the first to N-th step set signals LS[8:0], where L is 1 to N and control of the test MRS reset signal TMRS RESET.

FIG. 3 is a circuit diagram illustrating the conventional N-step test mode MRS unit 30-M. The N-step test mode MRS unit of FIG. 3 includes a NAND gate NAND, a PMOS transistor PMOS, an NMOS transistor NMOS, a transmission gate TG, and four inverters INV1 to INV4. The first to N-th step set signals LS[8:0], where L is 1 to N, are applied to the NAND gate NAND, an inverted test MRS reset signal TMRS RESET is applied to a gate of the PMOS transistor PMOS, and a power voltage VDD is applied to a gate of the NMOS transistor NMOS. An output of the NAND gate NAND is applied to a gate of the PMOS transistor of the transmission gate TG, and an inverted output of the NAND gate NAND is applied to a gate of the NMOS transistor of the transmission gate TG. A drain of the NMOS transistor NMOS is applied to one side of the transmission gate TG, and the output of the transmission gate TG is inverted by the inverter INV2 and then outputted as the test control signal TMRS SET. A power voltage is applied to a source of the PMOS transistor PMOS, and a drain of the PMOS transistor is connected to the other side of the transmission gate TG and the inverted output of the fed back test control signal TMRS SET.

Here, the first to N-th step set signals LS[8:0], where L is 1 to N, are decoding signals to prevent the chip size from being increased because the chip size is increased in increments of connection wires for connecting selected lines to the actual circuit when the test MRS unit selects each item to add a test MRS item.

An operation of the conventional N-th test mode MRS unit 30-1 . . . 30-M circuit is described below with reference to FIG. 3.

In FIG. 3, if the test MRS reset signal TMRS RESET is applied with a low level, it is inverted to a high level by the fourth inverter INV4 and then applied to the gate of the PMOS transistor PMOS. The PMOS transistor PMOS is turned off, and the test control signal TRMS SET maintains a low level. However, if all of the first to N-th step set signals LS[8:0], where L is 1 to N applied to the NAND gate NAND have a high level, the NAND gate NAND outputs a low level, and a low level of a ground voltage passing through the NMOS transistor NMOS passes through the transmission gate TG, and so the test control signal TMRS SET having a high level is finally outputted, whereby a test MRS item is applied. If even one of the N input signals has a low level, the NAND gate NAND outputs a high level, and a low level passing through the NMOS transistor NMOS does not pass through the transmission gate TG, and the test control signal TMRS SET is fed back through the third inverter INV3 and then inverted again by the second inverter INV2, whereby the test control signal TMRS SET is maintained to a high level. Meanwhile, if the test MRS reset signal TMRS RESET having a high level is applied, it is inverted to a low level by the fourth inverter INV4 and then applied to the gate of the PMOS transistor PMOS. The PMOS transistor is turned on, and the power voltage VDD passes through the PMOS transistor PMOS and the second inverter INV2, so that the test control signal TMRS SET having a low level is outputted.

FIG. 4 is a timing diagram illustrating an N-step test mode operation of the conventional semiconductor memory device. FIG. 4 shows a timing diagram of signals such as a clock signal CLK, a clock enable signal CLE, a chip select bar signal /CS, a row address strobe bar signal /RAS, a column address strobe bar signal /CAS, a write enable bar signal /WE, a bank address bar signal /BA[1:0], and mode setting signals AO through A12 represented herein by the notation A[12:0]. The clock signal CLK is toggled by sequentially repeating a low level and a high level, the clock enable signal CLE has a high level, and the signals /CS, /RAS, /CAS, /WE, and /BA[1:0] have a low level, and a test mode is entered by a combination of the commands and the mode setting signals A[12:0], that is, by setting "1000" to A[7:4] and loading values of the mode setting signals to A[3:0] and A[12:9] during five cycles. Here, A[7:4] are bits which are not frequently used, and since it functions as a password for preventing easy entry into the test mode to set "1000" as the safety key for allowing entry into the test mode from a normal mode, the circuit designer can, use a combination of different bits.

In FIG. 4, all operations are initiated when the clock signal CLK goes high. In order to apply a first test mode MRS item, the mode setting signals A[3:0] and A[12:8] load data of 1S0 to 1S8 of the first step, 2S0 to 2S8 of the second step, and NS0 to NS8 of the N-th step, latches the data after a predetermined time lapses and then deviates from a latch cycle. In order to apply a second test mode MRS item, the mode setting signals A[3:0] and A[12:8] load data of 1S0 to 1S8 of the first step, 2S0 to 2S8 of the second step, and NS0 to NS8 of the N-th step again, and latches the data like when the first test mode MRS item is applied. During an operation of the test mode operation, the test mode can be reset, if needed, by setting of the mode register provided in a specification table of a data sheet, for example, by setting a value of A[7] to "0".

However, if the test mode for an individual item is reset by the above described method, all of the test mode MRS items are reset. For the foregoing reason, even when a reset is needed for a re-experimentation or retest of a certain item, the test mode should be inevitably initiated again after resetting all of the test mode MRS items as represented by values m0 through m12 in FIG. 4. That is, a reset for an individual item is impossible because the reset signal of the conventional N-step test mode is shared by all of the test MRS set units, and entry into the test mode is also canceled when the test mode is reset because the reset signal of the test mode register is generated by the normal mode register set.

For the foregoing reasons, since the test using the test MRS set applies the test mode MRS reset just once, the test mode must be entered again in order to carry out the experimentation for another test item. For the experimentation in which simultaneous application of the test mode MRS items is impossible or a combination of a plurality of test mode items is needed, "test mode entry", "test mode item application", and "test mode release" should be innumerably and repetitively performed. A finite time for entry of the test MRS set and application of an individual item is needed, and so such repetition in every experimentation operation is extremely time-consuming.

SUMMARY OF THE INVENTION

Exemplary embodiments of the present invention provide a semiconductor memory device in which in a test mode of the semiconductor memory device, test items can be individually reset to thereby reduce a test time and bring about a testing convenience.

An exemplary embodiment of the present invention provides a test mode semiconductor memory device that includes a control signal generator for combining command signals applied from an external portion to generate a test signal; a set/reset signal generator for receiving a mode setting signal applied from the external portion in response to the test signal and generating first and second set/reset signals when the mode setting signal is a signal that designates an individual set/reset; a test logic portion for storing and then outputting the mode setting signal in response to the test signal; a set/reset master signal generator for receiving the first and second set/reset signals to output a set/reset master signal for commonly controlling a test mode of internal blocks of the semiconductor memory device; and a test control signal generator for combining an output signal of the test logic portion to generate a plurality of control signals and generating the set/reset master signal as a plurality of test control signals in response to the plurality of control signals.

An exemplary embodiment of the present invention provides a test mode semiconductor memory device that includes a control signal generator for combining command signals applied from an external portion to generate a test signal; a test logic portion for storing and then outputting the mode setting signal in response to the test signal; and a test control signal generator for combining the mode setting signals outputted from the test logic portion to generate a plurality of set signals and a plurality of reset signals and generating a plurality of test control signals whose state is changed when value variation of the mode setting signals is detected.

BRIEF DESCRIPTION OF THE DRAWINGS

Exemplary embodiments of the present invention will be understood in more detail from the following descriptions taken in conjunction with the attached drawings in which.

DETAILED DESCRIPTION OF THE INVENTION

Exemplary embodiments of the present invention will be described more fully hereinafter with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 4:
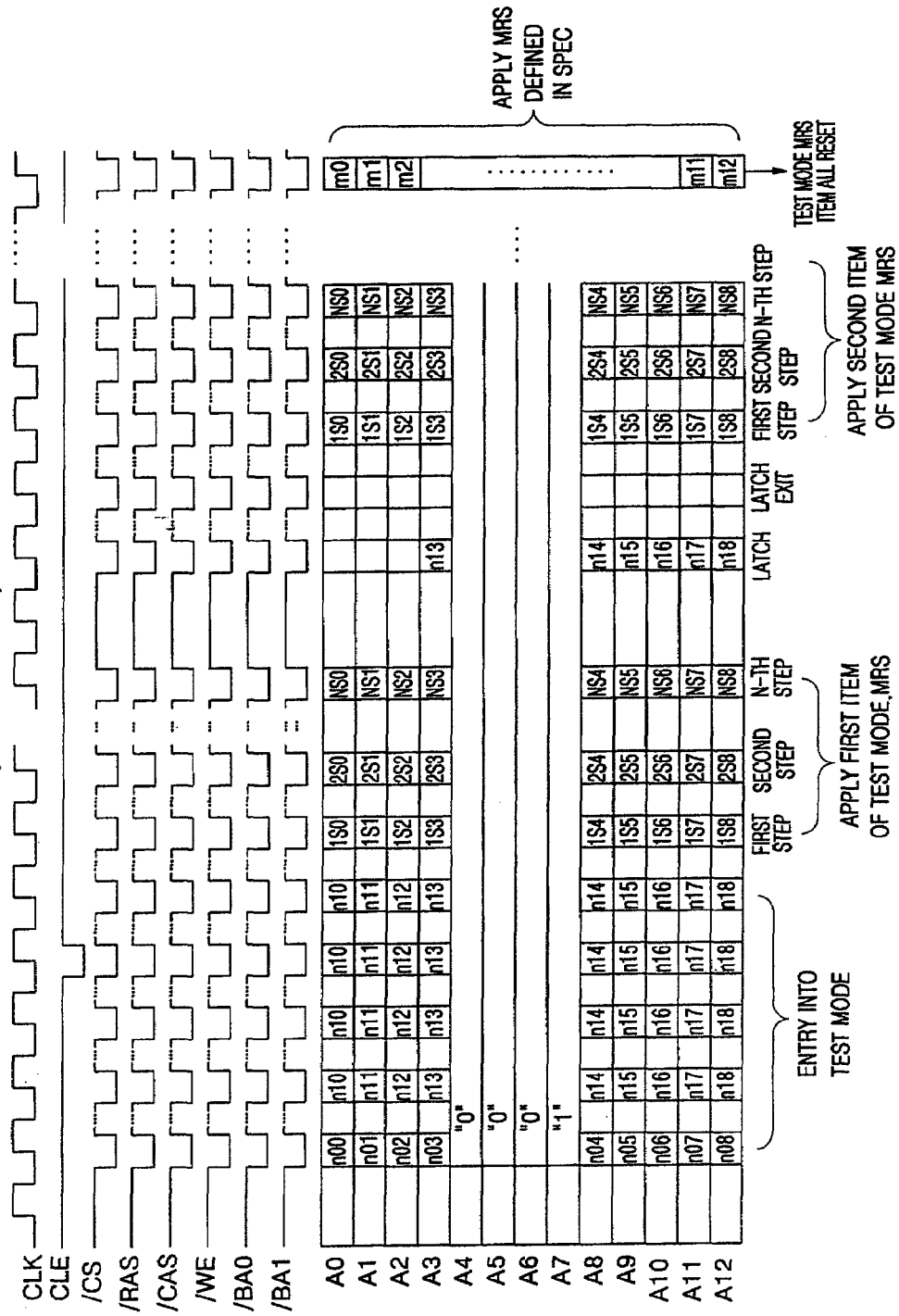
FIG. 4 is a timing diagram illustrating an N-step test mode operation of the conventional semiconductor memory device.
Figure 5:
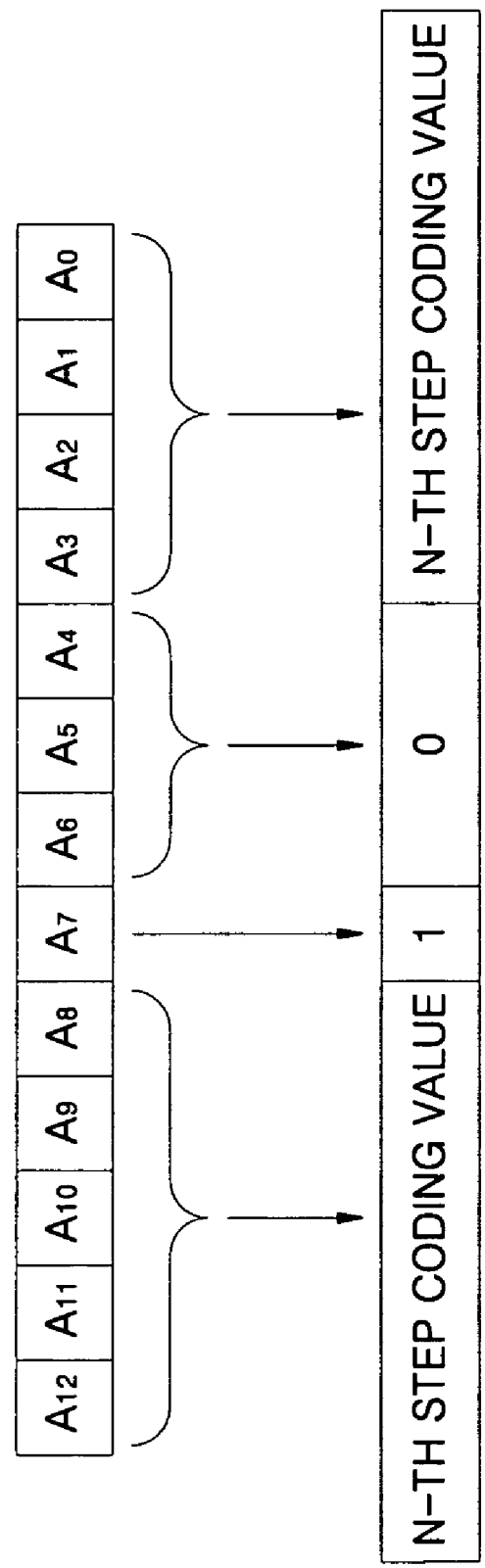
FIG. 5 is a schematic view illustrating a configuration of a mode register of a semiconductor memory device which is in a test mode according to an exemplary embodiment of the present invention.

FIG. 5 is a schematic representation illustrating a configuration of a mode register of a semiconductor memory device which is in a test mode according to an exemplary embodiment of the present invention. An input of the mode register is connected to an address pin, and so the mode register receives data through the address pin. The typical mode register programs and stores various options such as an OP CODE, a CAS latency, a burst type, and a burst length, but in the test mode a 9-bit coding value of each of the N step test modes of the first to N-th step control are loaded to values A0 to A3 represented herein by the notation A[3:0] and values A8 to A12 represented herein by the notation A[12:8], and "1000" which is a data value for the semiconductor memory test mode entry is loaded to values A4 to A7 represented by the notation A[7:4], as shown in FIG. 4. Here, A[7:4] are bits which are not frequently used, and since they function as a password for preventing easy entry into the test mode they are set to "1000" as the safety key for allowing entry into the test mode from a normal mode, however, the circuit designer can use a combination of different bits.

Figure 6:
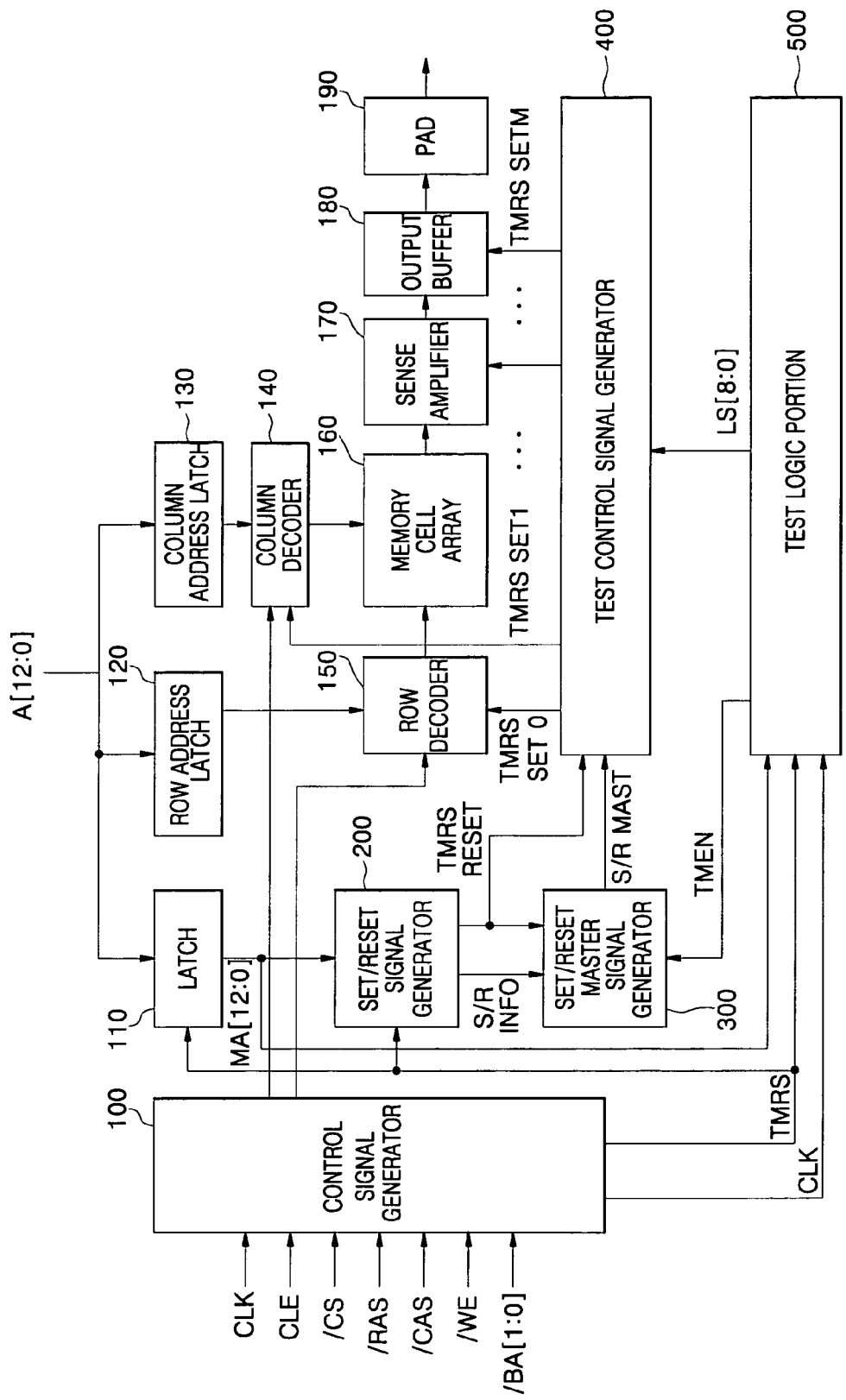
FIG. 6 is a block diagram illustrating a semiconductor memory device according to the exemplary embodiment of the present invention.

FIG. 6 is a block diagram illustrating a semiconductor memory device according to an exemplary embodiment of the present invention. The test mode semiconductor memory device of FIG. 5 includes a control signal generator 100, a latch 110, a row address latch 120, a column address latch 130, a column decoder 140, a row decoder 150, a memory cell array 160, a sense amplifier 170, an output buffer 180, a pad 190, a set/reset signal generator 200, a test control signal generator 400, a set/reset master signal generator 300, and a test logic portion 500. The test control signal generator 400 includes a plurality of test mode MRS units, and the test logic portion 500 includes a test mode enable portion, an MRS enable pulse generator, and MRS logic portions of plural steps.

The control signal generator 100 receives commands from an external portion of the test set up and outputs various control signals to the column decoder 140, the row decoder 150, and the test logic portion 500. The latch 110 receives the mode setting signals from the external portion via an address bus and transmits them to the set/reset signal generator 200 and the test logic portion 500. The row address latch 120 and the column address latch 130 receive the mode setting signals from the external portion and transmit them to the row decoder 150 and the column decoder 140, respectively. The column decoder 140 and the row decoder 150 are connected to the memory cell array 160, and an output of the memory cell array 160 is sequentially transmitted to the sense amplifier 170, the output buffer 180, and the pad 190.

The set/reset signal generator 200 receives the test signal TMRS from the control signal generator 100 and the mode setting signals MA[12:0] from the latch 110 to output the test MRS reset signal TMRS RESET and a set/reset information signal S/R INFO. The test logic portion 500 receives the mode setting signals MA[12:0] from the latch 110 to output N-bit set signals LS[8:0], where L is 1 to N. The set/reset master signal generator 300 receives the step set signals LS[8:0], where L is 1 to N, and the test mode enable signal TMEN from the test logic portion 500 and the set/reset information signal S/R INFO from the set/reset signal generator 200 to output a set/reset master signal S/R MAST. The test control signal generator 400 receives the set/reset master signal S/R MAST from the set/reset master signal generator 300, the step set signals LS[8:0], where L is 1 to N from the test logic portion 500 and the test MRS reset signal TMRS RESET from the set/reset signal generator 200 to output and apply the test control signals TMRS SET0 to TMRS SETM to all item test target blocks of the semiconductor memory device.

Functions of the blocks of the semiconductor memory device of FIG. 6 are described below.

The control signal generator 100 combines command signals applied from the external portion to generate the test signal TMRS, and the latch 110 receives the mode setting signals from the external portion and transmits them to the internal portion of the semiconductor memory device. The column address latch 130 or the row address latch 120 latches the column address or the row address to output an internal address. The column decoder 140 and the row decoder 150 decode the internal address to access a plurality of word lines and bit lines. The memory cell array 160 writes/reads data into/from a plurality of memory cells connected between a plurality of word lines and a plurality of bit lines. The sense amplifier 170 amplifies a low voltage signal charged by the bit line to a power voltage VDD level to have a driving ability for transferring it to the external portion. The output buffer 180 transmits information of the bit line to the external portion via the pad 190.

The set/reset signal generator 200 combines the mode setting signals MA[12:0] to generate the test MRS reset signal TMRS RESET and the set/reset information signal S/R INFO in response to the test signal TMRS. The test logic portion 500 stores the mode setting signals MA[12:0] sequentially applied in response to the test signal TMRS, combines the stored mode setting signals MA[12:0] to generate a plurality of step set signals LS[8:0], where L is 1 to N when the mode setting signals MA[12:0] are completely stored. The set/reset master signal generator 300 receives the test MRS reset signal TMRS RESET, the set/reset information signal S/R INFO and the mode setting signals MA[12:0] to output the set/reset master signal S/R MAST for commonly controlling the test mode of the internal blocks of the semiconductor memory device. The test control signal generator 400 receives the test MRS reset signal TMRS RESET to reset and initialize the test mode of the internal blocks of the semiconductor memory device. The test control signal generator 400 then receives the set/reset master signal S/R MAST and the test MRS reset signal TMRS RESET to generate a plurality of test control signals TMRS SET0 to TMRS SETM of corresponding items in response to each of a plurality of step set signals LS[8:0], where L is 1 to N in order to test a time delay margin or freedom degree of data path of the internal blocks of the semiconductor memory device.

Operation of the inventive test mode semiconductor memory device is described below with reference to FIG. 6.

When the control signal generator 100 receives various commands from the external portion to output signals (including a clock signal CLK and a test signal TMRS) for controlling internal operations of the semiconductor memory device and the latch 110 receives the mode setting signals A[12:0] via the address bus from the external bus and outputs them, the test logic portion 500 receives the clock signal CLK and the test signal TMRS from the control signal generator 100 and a combination of the mode setting signals MA[12:0] from the latch 110 to recognize entry into the test mode, and outputs the test mode enable signal TMEN, the test MRS reset signal TMRS RESET, and the N-bit set signals LS[8:0], where L is 1 to N of first to N-th steps MRSes. The set/reset signal generator 200 receives the mode setting signals MA[12:0] from the latch 110 to output the set/reset information signal S/R INFO according to a combination of the mode setting signals defined by the circuit designer. The set/reset master signal generator 300 receives the N-bit step set signals LS[8:0], where L is 1 to N from the test logic portion 500 and the set/reset information signal S/R INFO from the set/reset signal generator 500 to output the set/reset master signal S/R MAST for controlling the test mode of an individual internal block or a plurality of internal blocks of the semiconductor memory device according to a combination of the first to N-th step set signals LS[8:0], where L is 1 to N.

At this time, the test control signal generator 400 receives the test MRS reset signal TMRS RESET from the set/reset signal generator 200 to reset and initialize the test mode of the internal blocks of the semiconductor memory device. The test control signal generator 400 then receives the first to N-th step set signals LS[8:0], where L is 1 to N from the test logic portion 500 and decodes them to select a certain test mode MRS unit before receiving the set/reset master signal S/R MAST from the set/reset master signal generator 300 to output the test control signals TMRS SET0 to TMRS SETM of the corresponding items. The test control signals TMRS SET0 to TMRS SETM are applied to the internal blocks of the semiconductor memory device, i.e., the row decoder 150, the column decoder 140, the sense amplifier 170, the output buffer 180, and the pad 190 to individually perform the test MRS reset according to each test item in order to test the time delay margin or the freedom degree of data path of the internal blocks of the semiconductor memory device.

Figure 7:
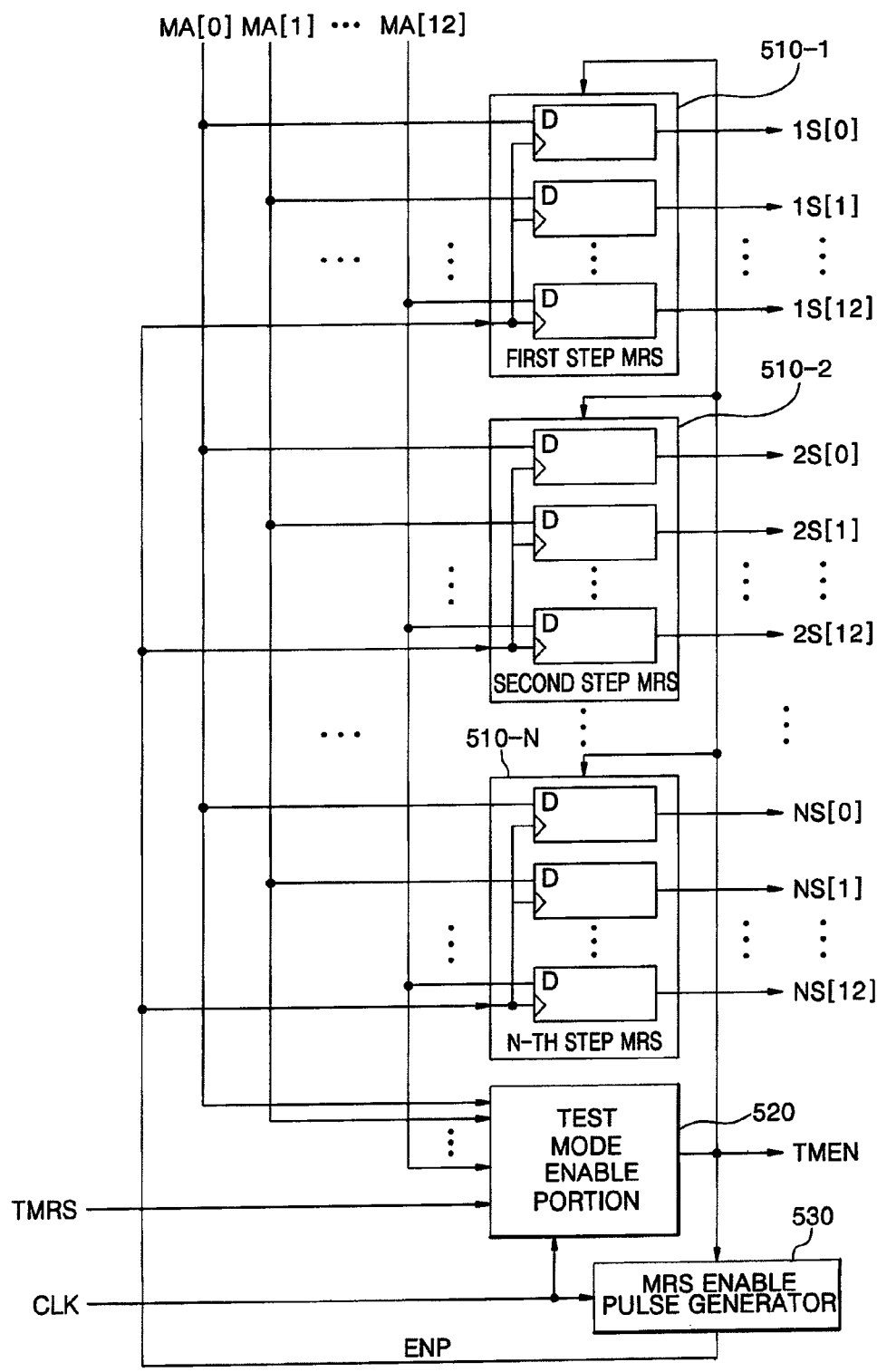
FIG. 7 is a block diagram illustrating a test logic portion of the semiconductor memory device according to the exemplary embodiment of the present invention.

FIG. 7 is a block diagram illustrating the test logic portion 500 of the semiconductor memory device according to the exemplary embodiment of the present invention receiving test mode signals MA[0], MA[1], . . . MA[12] and producing set signals 15[0], 15[1]; . . . 15[12], 25[0], 25[1],. . . 25[12]. . . NS[0], NS[1], . . . NS[12].The test logic portion shown in FIG. 7 includes a test mode enable portion 520, an MRS enable pulse generator 530, and first to N-th step MRS logics 510-1 to 510-N. Each step MRS logic includes a plurality of D-flip flops. The test mode enable portion 520 receives the mode setting signals MA[8] through MA[12] represented herein by the notation MA[12:8] and MA[0] through MA[3] represented herein by the notation MA[3:0] from the latch 110 and the test signal TMRS and the clock signal CLK from the control signal generator 100 to output the test mode enable signal TMEN used to enter the test mode. The MRS enable pulse generator 530 receives the clock signal CLK from the control signal generator 100 and the test mode enable signal TMEN from the test mode enable portion 520 to generate the test MRS enable pulse ENP. Each step MRS logic receives the mode setting signals MA[12:8] and MA[3:0] from the latch 110, the test MRS enable pulse ENP from the MRS enable pulse generator 530, and the test mode enable signal TMEN from the test mode enable portion 520 and outputs the first to N-th step set signals LS[8:0], where L is 1 to N.

Operation of the test logic portion 500 is described below with reference to FIG. 7.

When the test mode enable portion 520 receives the mode setting signals MA[12:8] and MA[3:0] from the latch 110 and the test signal TMRS from the control signal generator 100 to output the test mode enable signal TMEN, the test mode enable signal TMEN is outputted in order in each step according to a combination of the mode setting signals MA[12:8] and MA[3:0]. At this time, the MRS enable pulse generator 530 receives the clock signal CLK from the control signal generator 100 and synchronizes it according to the test mode enable signal TMEN, which sequentially becomes a high level, to thereby generate the test MRS enable pulse ENP in each step.

The first step MRS logic 510-1 receives the test mode enable signal TMEN from the test mode enable portion 520 to enter the test mode, and a plurality of D-flip flops in the first step MRS logic 510-1 receive the mode setting signals MA[12:8] and MA[3:0] and the first test MRS enable pulse ENP to output first step set signals 1S[8] through 1S[12] represented herein by the notation 1S[12:8] and 1S[01] through 1S[3] represented herein by the notation 1S[3:0]. The second step MRS logic 510-2 receives the test mode enable signal TMEN from the test mode enable portion 520 to enter the test mode, and a plurality of D-flip flops in the second step MRS logic 510-2 receive the mode setting signals MA[12:8] and MA[3:0] and the second test MRS enable pulse ENP which becomes a high level after a first test mode item applying time and outputs the second step set signals 2S[8] through 2S[12] represented herein by the notation 2S[12:8] and 2S[0] through 2S[3] represented herein by the notation 2S[3:0]. Similarly, the N-th step MRS logic 510-N receives the N-th test MRS enable pulse ENP and outputs the N-th step set signals NS[8] through NS[12] represented herein by the notation NS[12:8] and NS[0] through NS[3] represented herein by the notation NS[3:0].

Figure 8:
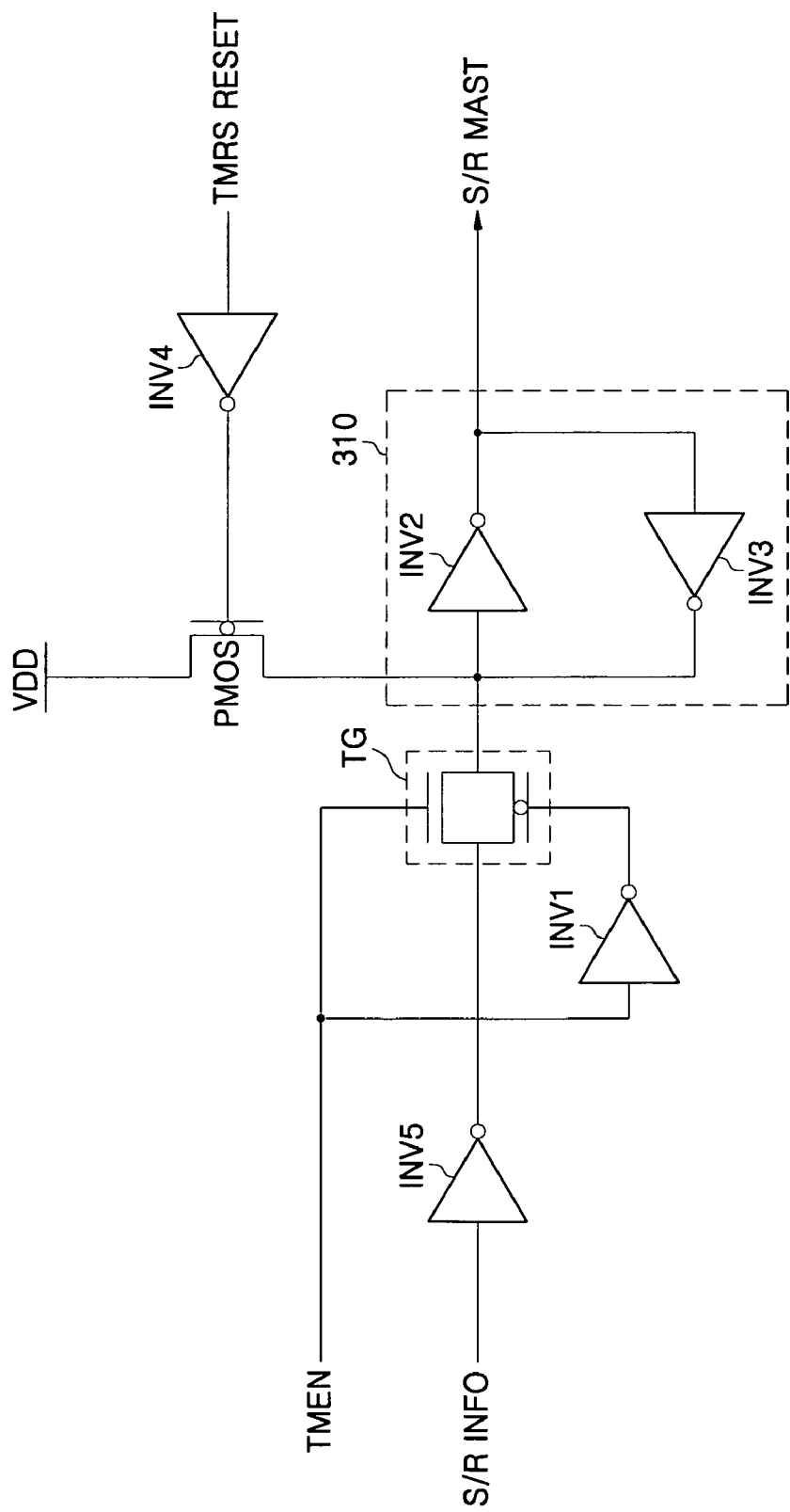
FIG. 8 is a circuit diagram illustrating a set/reset master signal generator according to the exemplary embodiment of the present invention.

FIG. 8 is a circuit diagram illustrating the set/reset master signal generator 300 according to the exemplary embodiment of the present invention. The set/reset master signal generator 300 of FIG. 8 includes a PMOS transistor PMOS, a transmission gate TG, three inverters INV1, INV4 and INV5, and a latch 310. The latch 310 includes two inverters INV2 and INV3. The test mode enable signal TMEN from the test logic portion 500 is applied to the first inverter INV1, and the test MRS reset signal TMRS RESET from the test logic portion 500 is inverted by the fourth inverter INV4 and then applied to a gate of the PMOS transistor PMOS. The test mode enable signal TMEN is applied to a gate of the NMOS transistor of the transmission gate TG, and an output of the first inverter INV1 is applied to the gate of the PMOS transistor of the transmission gate TG The set/reset information signal S/R INFO from the set/reset signal generator 200 of FIG. 6 is inverted by the fifth inverter INV5 and then applied to one side of the transmission gate TG, and the output from the other side of the transmission gate TG is inverted by the second inverter INV2 and then outputted as the set/reset master signal S/R MAST. A power voltage VDD is applied to a source of the PMOS transistor PMOS, and a drain of the PMOS transistor PMOS is connected to a node at the other side of the transmission gate TG and where an output of the third inverter INV3 consists of the set/reset master signal S/R MAST having been fed back and inverted by the third inverter INV3.

Operation of the set/reset master signal generator 300 of FIG. 8 is described below.

When the test MRS reset signal TMRS RESET having a high level is applied as an initial condition, it is inverted to a low level by the fourth inverter INV4 and then applied to the gate of the PMOS transistor PMOS. The PMOS transistor PMOS is turned on to allow the power voltage VDD to pass through, so that the set/reset master signal S/R MAST which is inverted to a low level by the second inverter INV2 is outputted, thereby resetting and initializing the test mode of the internal blocks of the semiconductor memory device.

When the test MRS reset signal TMRS RESET transitions to a low level, it is inverted to a high level by the fourth inverter INV4 and then applied to the gate of the PMOS transistor PMOS. The PMOS transistor PMOS is turned off, and the set/reset master signal S/R MAST maintains a low level which is the previous value. However, the test mode enable signal TMEN having a high level is applied to the gate of the NMOS transistor of the transmission gate TG and at the same time is inverted by the first inverter INV1, so that the low level is applied to the gate of the PMOS transistor of the transmission gate TG to open the transmission gate TG As a result, the inverted value of the set/reset information signal S/R INFO passes through the transmission gate TG and then is inverted again by the second inverter INV2, whereby the value which is inverted again by the second inverter INV2 is finally outputted as the set/reset master signal S/R MAST.

Figure 2:
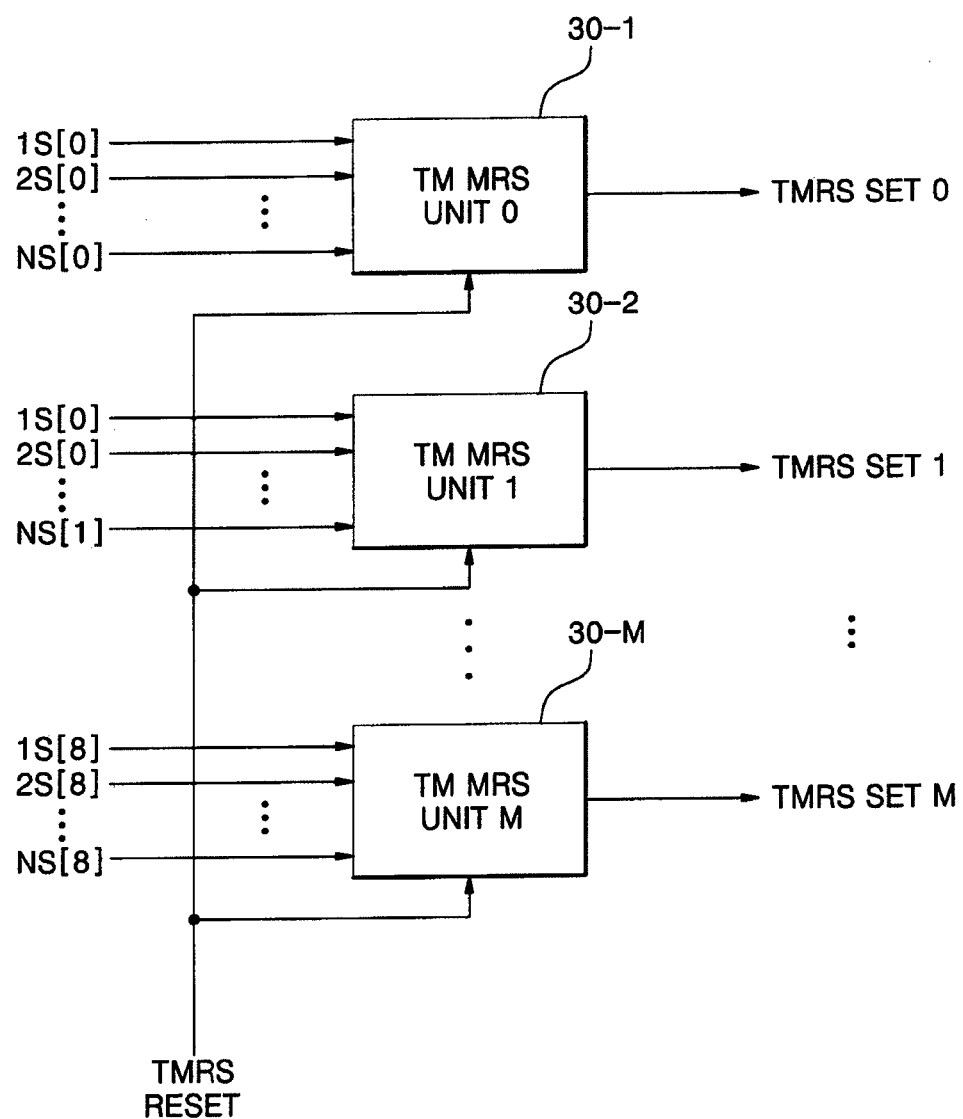
FIG. 2 is a block diagram illustrating a test control signal generator of the conventional test mode semiconductor memory device.
Figure 3:
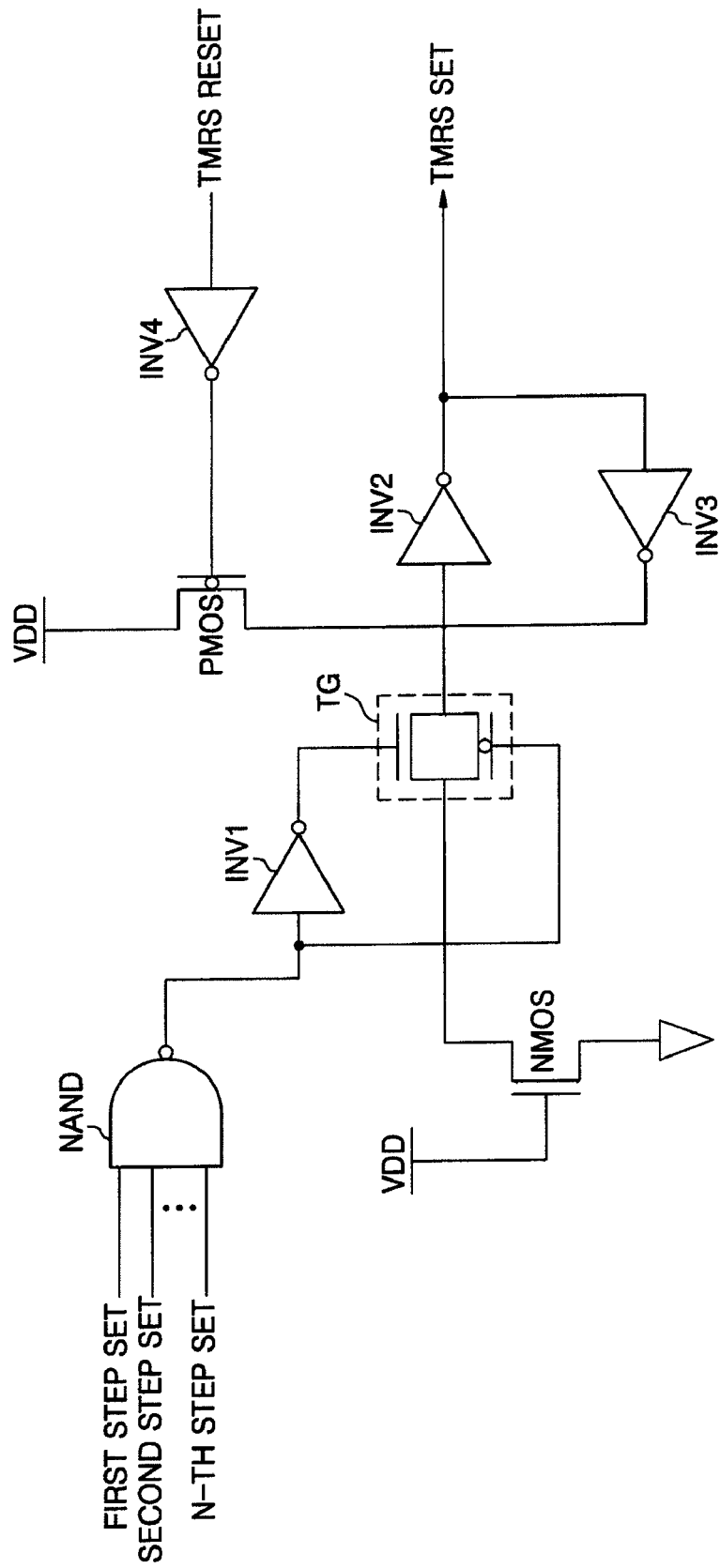
FIG. 3 is a circuit diagram illustrating a conventional N-step test mode MRS unit.
Figure 9:
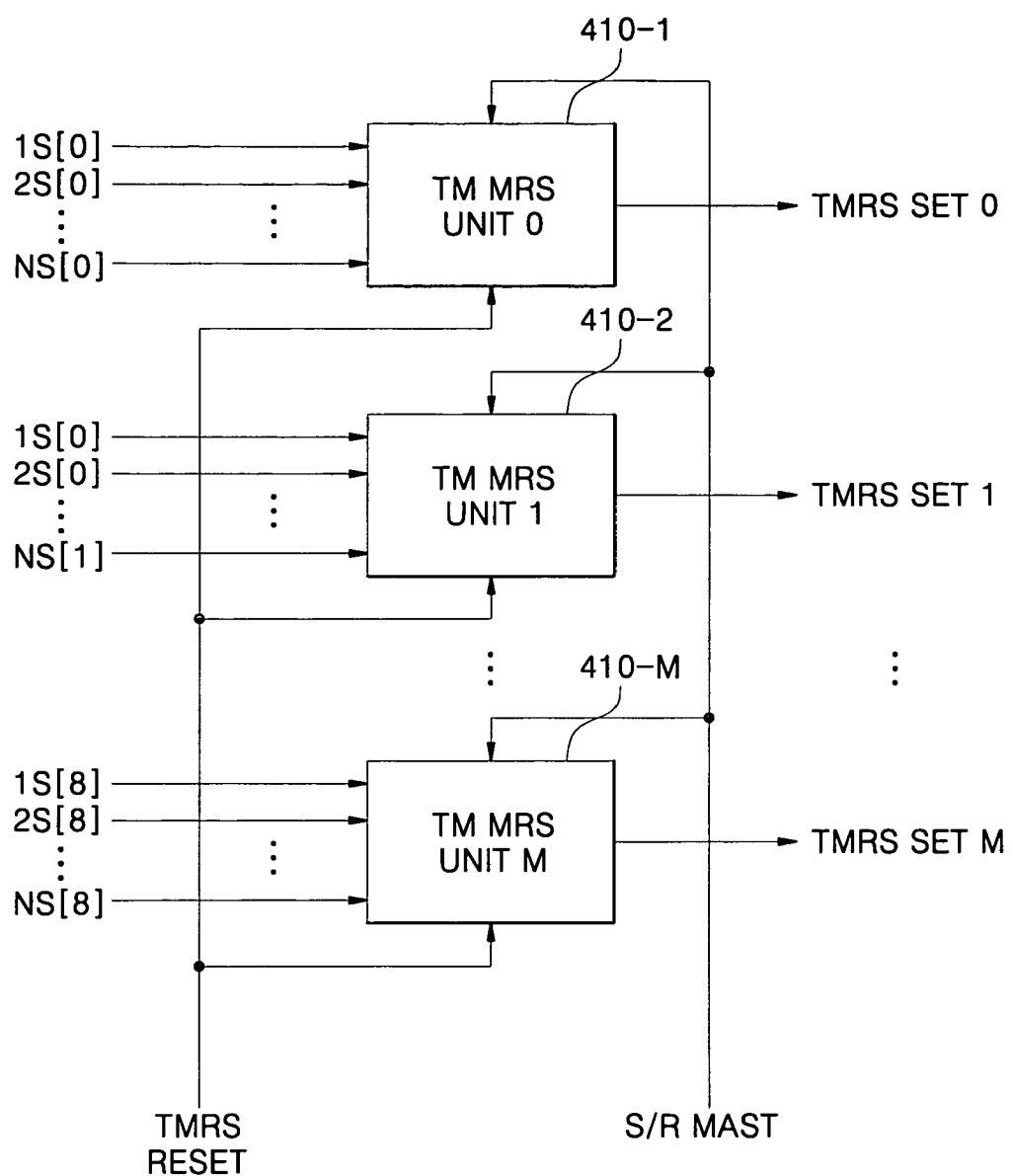
FIG. 9 is a block diagram illustrating a test control signal generator of the semiconductor memory device according to the exemplary embodiment of the present invention.

FIG. 9 is a block diagram illustrating the test control signal generator 400 of the semiconductor memory device according to the exemplary embodiment of the present invention. The test control signal generator of FIG. 9 is different from that of FIG. 2 in the fact that a combination of the first to N-th step set signals LS[8:0], where L is 1 to N from the test logic portion and the set/reset master signal S/R MAST from the set/reset master signal generator are applied to an input terminal of each test mode MRS unit 410-1 to 410-M, and thus a description of the connection relations between components is omitted.

Operation of the test control signal generator 400 of FIG. 9 is described below.

If a combination of the zero-th bits 1S[0] to NS[0] of the first to N-th step set signals LS[8:0], where L is 1 to N, the set/reset master signal S/R MAST and the test MRS reset signal TMRS RESET are applied to an input terminal of the first test mode MRS unit 410-1, and so the first test mode MRS unit 410-1 is selected according to predetermined values of the first to N-th step set signals LS[8:0], where L is 1 to N. The set/reset master signal S/R MAST having a high level is outputted as the first test control signal TMRS SET0 and maintains a high level to keep the test mode of the corresponding item for testing the time delay margin or the freedom degree of the data path of, for example, the row decoder. Otherwise, when the set/reset master signal S/R MAST having a low level is outputted as the first test control signal TMRS SET0 and then inverted to a low level, the test mode MRS of the corresponding item is reset to thereby finish testing the row decoder, which is the internal test target block of the semiconductor memory device.

If a combination of the zero-th bits 1S[0] to (N-1)S[0] of the first to (N-1)-th step set signals LS[8:0], where L is 1 to N-1, and the first bit NS[1] of the N-th step set signal NS[8:0], the set/reset master signal S/R MAST, and the test MRS reset signal TMRS RESET are applied to the input terminal of the second test mode MRS unit 410-2, so the second test mode MRS unit 410-2 is selected according to predetermined values of the step set signals LS[8:0], where L is 1 to N, the test mode for testing the time delay margin or the degree of freedom of the data path of, for example, the column decoder is maintained or reset and so finished according to the value of the second test control signal TMRS SET1 which is the output signal. Similarly, if a combination of the eighth bits 1S[8] to NS[8] of the first to N-th step set signals LS[8:0], where L is 1 to N the set/reset master signal S/R MAST and the test MRS reset signal TMRS RESET are applied to the input terminal of the M-th test mode MRS unit 410-M, so the M-th test mode MRS unit 410-M is selected according to predetermined values of the first to N-th step set signals LS[8:0], where L is 1 to N, the test mode for testing the time delay margin or the degree of freedom of the data path of, for example, the output buffer is maintained or reset and so finished according to the value of the M-th test control signal TMRS SETM, which is the output signal.

Figure 10:
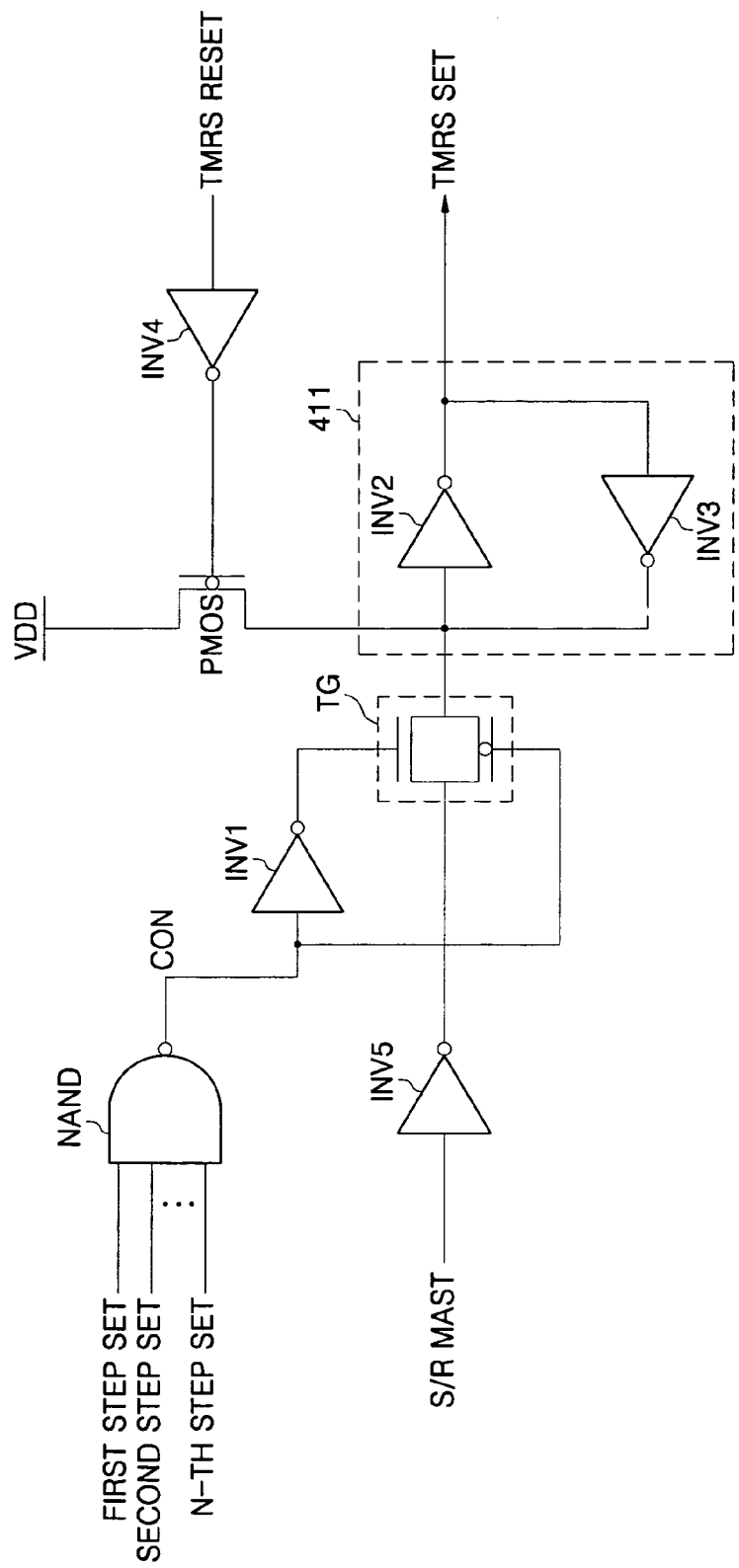
FIG. 10 is a circuit diagram illustrating a test mode MRS unit according to the exemplary embodiment of the present invention.

FIG. 10 is a circuit diagram illustrating the test mode MRS unit of the test control signal generator 400 according to the exemplary embodiment of the present invention. The test mode MRS unit of FIG. 10 is different from the set/reset master signal generator of FIG. 8 in the fact that the set/reset master signal S/R MAST instead of the set/reset information signal S/R INFO is applied to the fifth inverter INV5, the test mode enable signal TMEN from the test logic portion is not applied directly to the control terminal of the transmission gate TG but the first to N-th step set signals are applied to a NAND gate NAND and outputted to be applied to the control terminal of the transmission gate TG, and the test control signal TMRS SET instead of the set/reset master signal S/R MAST is outputted from the output terminal.

Operation of the test mode MRS unit of FIG. 10 is described below.

If the test MRS reset signal TMRS RESET having a high level is applied as the initial condition, it is inverted to a low level by the fourth inverter INV4 and then applied to the gate of the PMOS transistor PMOS. The PMOS transistor PMOS is turned on to allow the power voltage to pass through, so that the test control signal TMRS SET, which is inverted to a low level by the second inverter INV2, is outputted, whereby the test MRS item is not applied.

Thereafter, if the test MRS reset signal TMRS RESET transitions to a low level, it is inverted to a high level by the fourth inverter INV4 and then applied to the gate of the PMOS transistor PMOS. The PMOS transistor PMOS is turned off, and the test control signal TMRS SET maintains the low level which is a previous value. Thereafter, when all of the first to N-th step set signals applied to the NAND gate NAND to select the corresponding test mode MRS unit have a high level, a low level signal CON is outputted from the NAND gate NAND and then applied to the gate of the PMOS transistor of the transmission gate TG and at the same time it is inverted by the first inverter INV1 so that a high level is applied to the gate of the NMOS transistor of the transmission gate TG to open the transmission gate TG, and the inverted value of the set/reset master signal S/R MAST passes through the transmission gate TG and is inverted again by the second inverter INV2, whereby the value which is inverted again by the second inverter INV2 is finally outputted as the test control signal TMRS SET and the test MRS item is applied. If even one of the first to N-th step set signals has a low level, the NAND gate NAND outputs a high level which is applied to the gate of the PMOS transistor of the transmission gate TG and at the same time inverted by the first inverter INV1. The low level is applied to the gate of the NMOS transistor of the transmission gate TG and so the transmission gate TG is not opened, and thus the inverted value of the set/reset master signal S/R MAST does not pass through the transmission gate TG, and the test control signal TMRS SET is fed back through the third inverter INV3 and then inverted by the second inverter INV2 again, whereby the test control signal TMRS SET is maintained to a high level.

That is, the exemplary embodiment of the present invention uses a discrete set/reset master signal to perform a continuous set/reset of the test mode item, and all of the test mode MRS units share the set/reset master signal, so that when a certain test mode MRS unit is selected by the first to N-th step decoding, the test mode for testing the time delay margin or the degree of freedom of the data path of an individual internal block of the semiconductor memory device is maintained or reset and so finished by the set/reset master signal.

Figure 11:
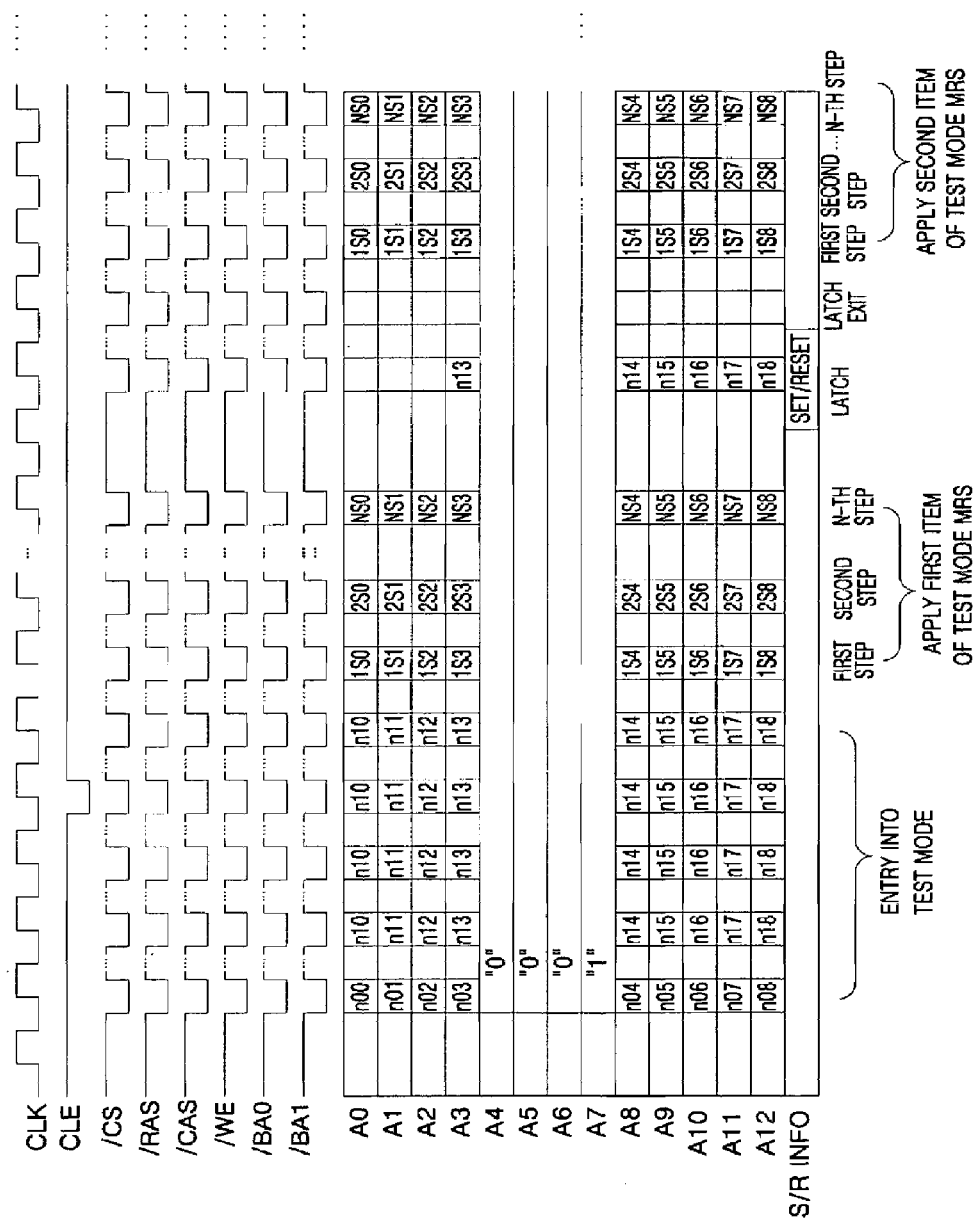
FIG. 11 is a timing diagram illustrating an operation of the semiconductor memory device according to the exemplary embodiment of the present invention.

FIG. 11 is a timing diagram illustrating an operation of the semiconductor memory device according to the exemplary embodiment of the present invention. FIG. 11 shows a timing diagram of signals such as a clock signal CLK, a clock enable signal CLE, a chip select bar signal /CS, a row address strobe bar signal /RAS, a column address strobe bar signal /CAS, a write enable bar signal /WE, a bank address bar signal /BA[1:0], mode setting signals A0 through A12 represented herein by the notion A[12:0], and a set/reset information signal S/R INFO. The timing diagram of FIG. 11 is similar to the timing diagram of FIG. 4 in the test mode entry process and the process for applying the first test mode MRS item. However, unlike the timing diagram of FIG. 4, in the semiconductor memory device according to the exemplary embodiment of the present invention, in order to apply the test mode MRS of the second internal block of the semiconductor memory device, the circuit designer loads predetermined data to the mode setting signals A[12:8] to output the set/reset information signal S/R INFO for determining whether to set or reset the test mode MRS for all internal blocks of the semiconductor memory device, and since it is possible to reset the test mode MRS of an individual item for each block using this signal, in order to set the test mode MRS of the second test target block, the mode setting signals A[3:0] and A[12;8] load data of 1S0 to 1S8 of the first step, 2S0 to 2S8 of the second step, and similarly NS0 to NS8 of the N-th step again and latch the data just as when the first test mode MRS item is applied and then deviate from a latch cycle.

In the exemplary embodiment of the present invention, whether the test control signal for an individual item is generated or not depends on a combination of the set/reset information of the mode setting signals, the test mode enable signal, and coding values of the first to N-th step set signals, whereby it is possible to perform the set/reset for an individual test MRS set item or a plurality of test MRSes. In order to implement this, the conventional test mode MRS unit circuit is modified, the test mode enable signal is used, and only a single connection line is needed for the set/reset master signal, and thus it is possible to achieve the convenience and high efficiency of the test MRS set experimentation, without extensively modifying the conventional test set-up and using an additional function.

Figure 1:
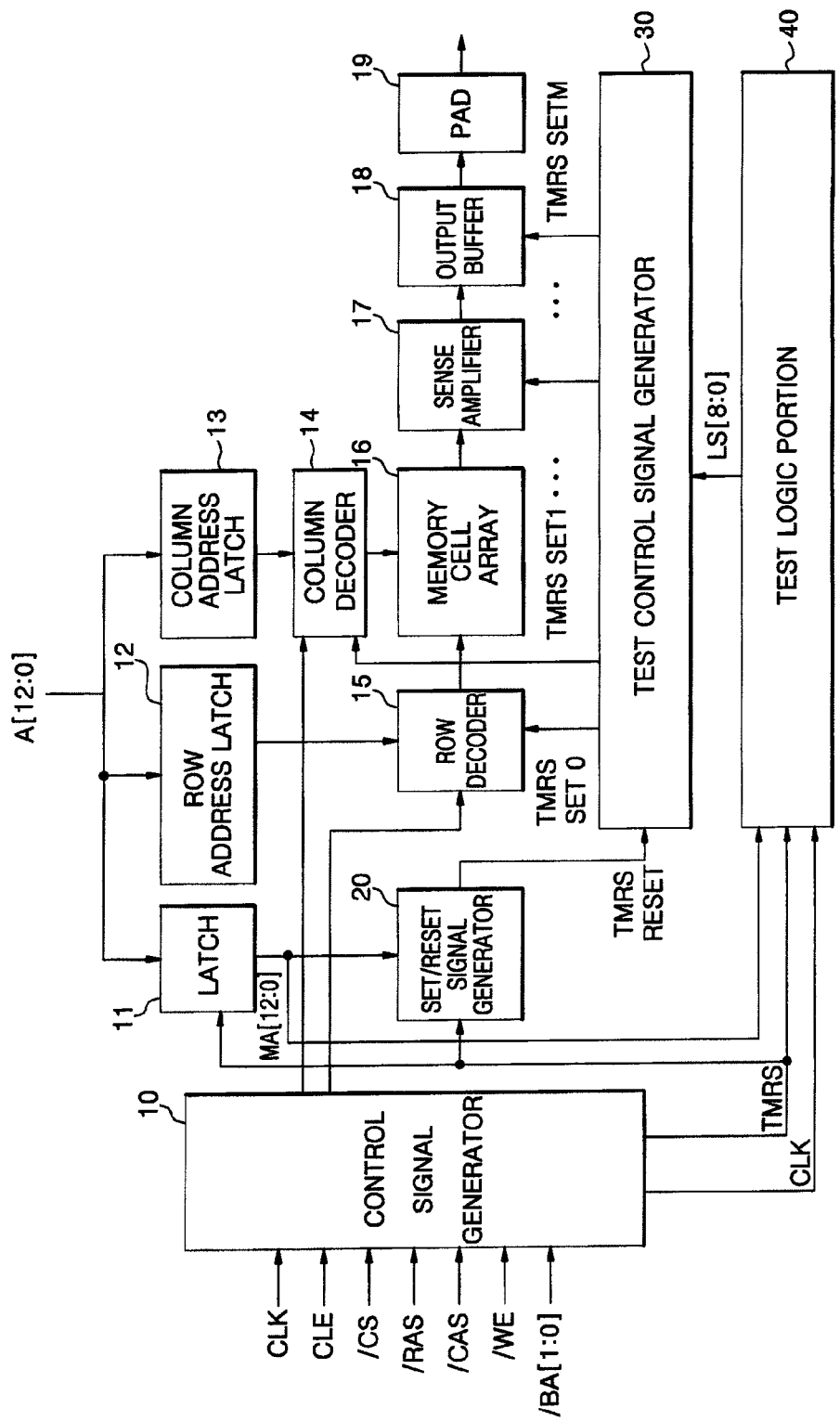
FIG. 1 is a block diagram illustrating a conventional test mode semiconductor memory device.

A semiconductor memory device according to an exemplary embodiment of the present invention differs in the internal components of the test mode MRS units of the test control signal generator, but is similar in block diagram to the conventional test mode semiconductor memory device of FIG. 1, and thus a description of the connection relations among the blocks and an operation of those is omitted. Also, the semiconductor memory device according to the exemplary embodiment of the present invention is different from the above-described embodiment of the present invention in the fact that it does not have the set/reset master signal generator and internal components of a plurality of test mode MRS units are different, and thus the test MRS reset signal TMRS RESET is inputted in response to each of a plurality of step set signals to generate a plurality of test control signals TMRS SET0 to TMRS SETM for each item. The test logic portion of FIG. 7 and the test control signal generator of FIG. 9 according to the above-described embodiment of the present invention are the same as those in this exemplary embodiment of the present invention, and thus a description of the connection relations among the blocks and an operation of those is omitted.

Compared to the exemplary embodiment of the present invention described above with reference to FIG. 6, the semiconductor memory device according to this exemplary embodiment of the present invention does not need to share the set/reset master signal among all of the test mode MRS units, and has the test mode MRS units configured in the form of a toggle flip flop (T flip flop) so that a plurality of test mode MRS unit circuits of the test control signal generator 400 can change the test control signal to a high level and a low level by itself.

Figure 12:
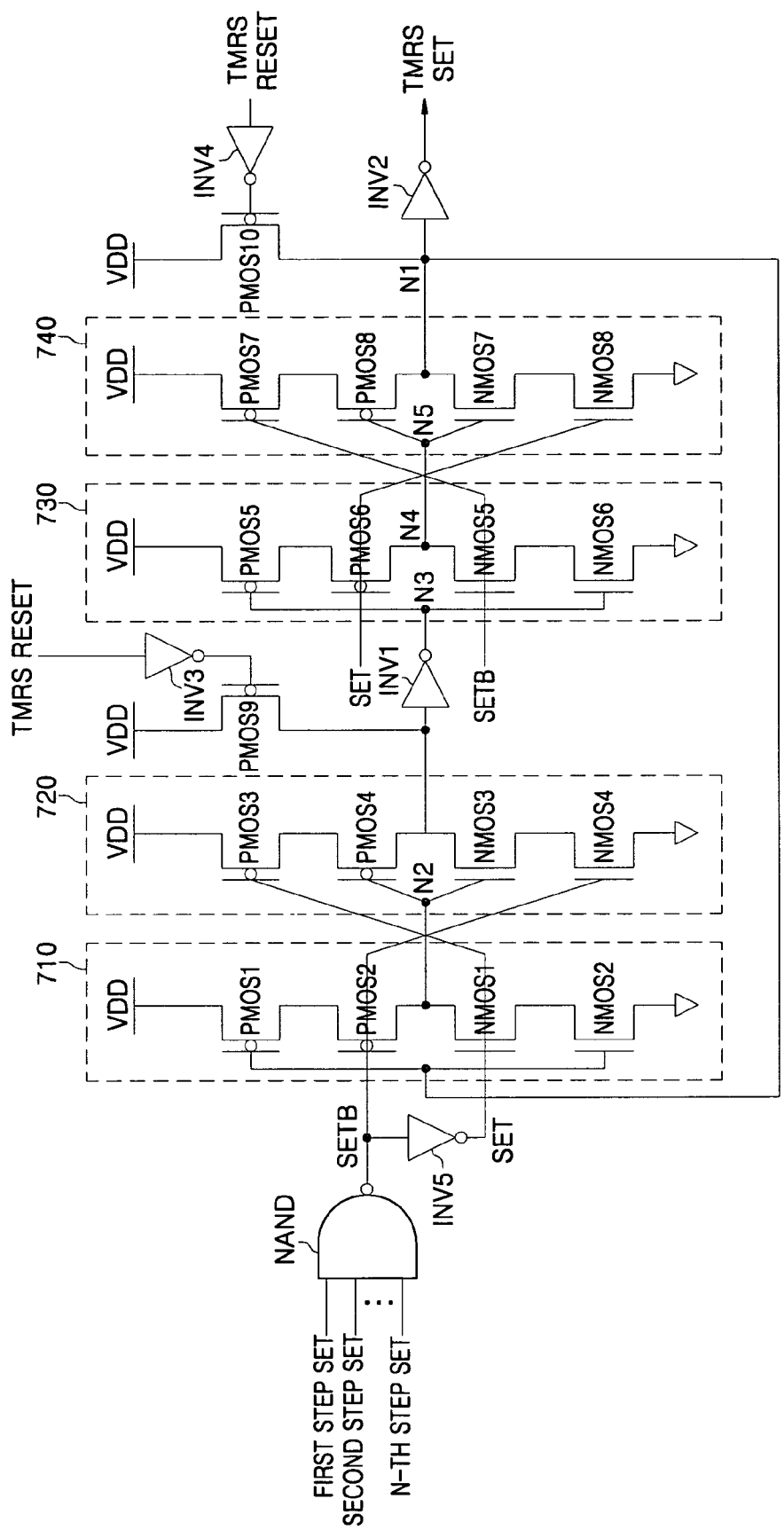
FIG. 12 is a circuit diagram illustrating a test mode MRS unit circuit according to an exemplary embodiment of the present invention.

FIG. 12 is a circuit diagram illustrating a test mode MRS unit circuit according to an exemplary embodiment of the present invention. The test mode MRS unit circuit of FIG. 12 includes a single NAND gate NAND, 4-step clocked inverters 710 to 740, two PMOS transistors PMOS9 and PMOS 10, and five inverters INV1 to INV5. Each clocked inverter includes two PMOS transistors and two NMOS transistors.

First, the first to N-th step set signals are applied to an input terminal of the NAND gate NAND to output a reset signal SETB, and the reset signal SETB is inverted by the inverter INV5 to output a set signal SET.

The first step clocked inverter 710 is configured such that two PMOS transistors PMOS1 and PMOS2 are serially connected, a power voltage VDD is applied to one side, two NMOS transistors NMOS1 and NMOS2 are serially connected to a ground at another side, the PMOS transistor PMOS2 and the NMOS transistor N1 are connected to a node N2, and a reset signal SETB and a set signal SET are respectively applied to gates of the second PMOS transistor PMOS2 and the first NMOS transistor NMOS1 which are connected to each other. The second step clocked inverter 720 is configured such that the connection between the transistors is similar to the first step clocked inverter 710 but the set signal SET is applied to a gate of a third PMOS transistor PMOS3 to which the power voltage VDD is applied, and the reset signal SETB is applied to a gate of a fourth NMOS transistor NMOS4 whose one side is connected to ground. An output of the first step clocked inverter 710 is applied to gates of the fourth PMOS transistors PMOS4 and the third NMOS transistor NMOS3 of the second step clocked inverter 720. A drain of a ninth PMOS transistor PMOS9 is connected to a node N3 which is an output terminal of the second step clocked inverter 720, a source is connected to the power voltage VDD, and an inverted value of the test MRS reset signal TMRS RESET inverted by the third inverter INV3 is applied to a gate of the ninth PMOS transistor PMOS9.

Connection relations between the transistors of the third and fourth step clocked inverters 730 and 740 are similar to those of the first and second step clocked inverters 710 and 720, but the set signal SET and the reset signal SETB are respectively applied to gates of a sixth PMOS transistor PMOS6 and a fifth NMOS transistor NMOS5 of the third step clocked inverter 730, which are connected to each other, and the set signal SET and the reset signal SETB are respectively applied to gates of a seventh PMOS transistor PMOS7 and an eighth NMOS transistor NMOS8 of the fourth step clocked inverter 740.

An output of the second step clocked inverted 720 is inverted by the first inverter INV1 and then applied to a gate of a PMOS transistor PMOS5 connected to the power voltage VDD and a gate of an NMOS transistor NMOS6 connected to ground in the third step clocked inverter 730, and the PMOS transistor PMOS6 and the NMOS transistor NMOS5 are connected at a node N4. A connection between a tenth PMOS transistor PMOS10 and the second and fourth inverters INV2 and INV4 is similar to a connection between the ninth PMOS transistor PMOS9 and the first and third inverters INV1 and INV3. An output of the third step clocked inverter 730 is applied to a gate of an eighth PMOS transistor PMOS8 and a gate of a seventh NMOS transistor NMOS7 of the fourth step clocked inverter 740 through a node N5. An output of the fourth clocked inverter 740 is fed back through the node N1 to the gate of the first PMOS transistor PMOS1 to which the power voltage VDD is applied and the gate of the NMOS transistor NMOS2 whose one side is connected to ground in the first step clocked inverter 710 and at the same time it is inverted by the second inverter INV2 and outputted as the test control signal TMRS SET.

Figure 13:
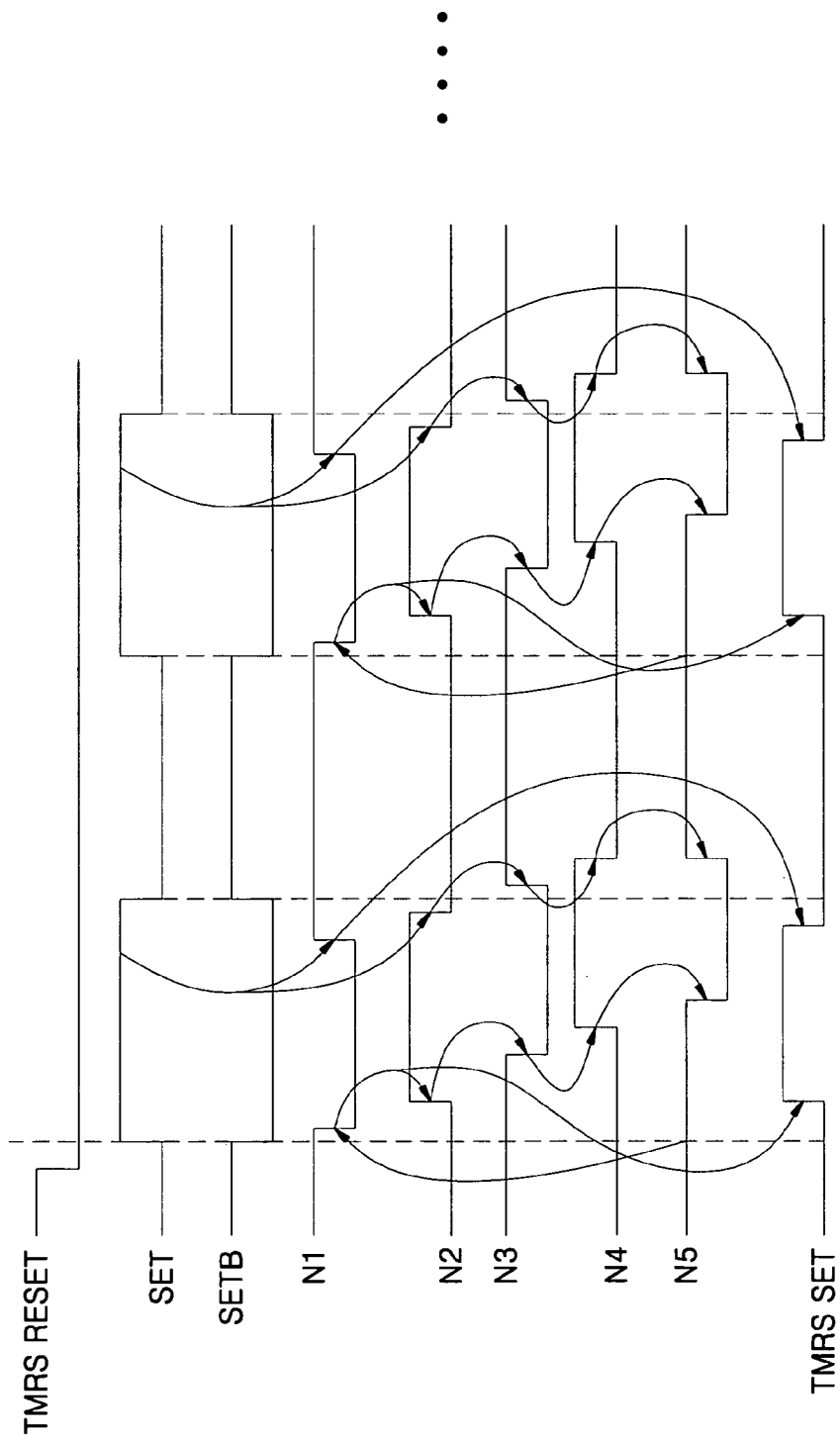
FIG. 13 is a timing diagram illustrating an operation of the test mode MRS unit circuit according to the exemplary embodiment of the present invention shown in FIG. 12.

FIG. 13 is a timing diagram illustrating an operation of the test mode MRS unit circuit according to the exemplary embodiment of the present invention shown in FIG. 12. In FIG. 13, the test MRS reset signal TMRS RESET, the set signal SET, the reset signal SETB, signals of the nodes N1 to N5, and the test control signal TMRS SET are shown.

Operation of the test mode MRS unit circuit is described below with reference to FIGS. 12 and 13.

The reset signal SETB is outputted with a low level and the set signal SET is outputted at a high level when all of the first to N-th step set signals are inputted with a high level, but the reset signal SETB is outputted with a high level and the set signal SET is outputted with a low level when at least one of the step set signals is applied with a low level.

If the test MRS reset signal TMRS RESET is applied with a high level as the initial condition in FIG. 13, the fourth inverter INV4 outputs a low level which is applied to the gate of the tenth PMOS transistor PMOS10, so that the tenth PMOS transistor PMOS10 is turned on. The power voltage VDD passes through the PMOS transistor PMOS10, the node N1 outputs a high level and the test control signal TMRS SET passing through the second inverter INV2 is outputted with a low level, whereby the test MRS item is not applied. At this time, since all of the first to N-th step set signals are in a state before they are inputted with a high level, in the state that the set signal SET has a low level and the reset signal SETB has a high level, the output of the node N1 is applied to the first PMOS transistor PMOS1 and the second NMOS transistor NMOS2 of the first step clocked inverter 710 and only the second NMOS transistor NMOS2 is turned on, so that a low level is outputted to the node N2. Similarly, if the test MRS reset signal TMRS RESET having a high level passes through the third inverter INV3 to be inverted to a low level which is applied to the gate of the ninth PMOS transistor PMOS9, the ninth PMOS transistor PMOS9 is turned on. The power voltage VDD passes through the ninth PMOS transistor PMOS9, the node N3 outputs a high level, and the high level passes through the first inverter INV1, so that the low level is outputted to the node N4. Also, at the initial stage, in the state that the set signal SET has a low level and the reset signal RESET has a high level, the output of the node N4 is applied to the fifth PMOS transistor PMOS5 and the sixth NMOS transistor NMOS6 of the third step clocked inverter 730, so only the fifth PMOS transistor PMOS5 is turned on, whereby a high level is outputted to the node N5.

Then, if the test MRS reset signal TMRS RESET transitions to a low level, the tenth PMOS transistor PMOS10 is turned off, and in this state the test control signal TMRS SET maintains the low level which is the previous value. Then, if all corresponding bits of the first to N-th step set signals applied to the NAND gate NAND to select the corresponding test mode MRS unit are inputted with a high level, the set signal SET transitions to a high level and the reset signal SETB to a low level, and then the set signal SET and the reset signal SETB are respectively applied to the gates of the seventh PMOS transistor PMOS7 and the eighth NMOS transistor NMOS8 of the fourth step clocked inverter 740, and if a high level output of the node N5 is applied to the gates of the eighth PMOS transistor PMOS8 and the seventh NMOS transistor NMOS7 of the fourth step clocked inverter 740, only the seventh NMOS transistor NMOS7 is turned on, and so the node N1 is inverted to a low level, the test control signal TMRS SET passing through the second inverter INV2 again is outputted with a high level, whereby the corresponding test mode MRS unit is selected and the test MRS item is applied to the corresponding block of the semiconductor memory device.

Thus, the signal of the node N2 passing through the first step clocked inverter 710 is inverted to a high level, the signal of the node N3 passing through the second step clocked inverter 720 is inverted to a low level, the signal of the node N4 passing through the first inverter INV1 again is inverted to a high level, and the signal of the node N5 passing through the third step clocked inverter 730 is inverted to a low level. In this state, the signal of the node N1 passing through the fourth step clocked inverter 740 is inverted to a high level, and the test control signal TMRS SET passing through the second inverter INV2 is outputted with a low level, whereby the test MRS item is not applied to the corresponding block of the semiconductor memory device.

The value of the node N1 having a high level passes through the first step clocked inverter 710 again and so the signal of the node N2 is inverted to a low level, and if the set signal SET maintains a high level and the reset signal SETB maintains a low level, the values of the nodes N3 to N5 maintain the previous values, but if in order to test the next block of the semiconductor memory device even one of the corresponding bits of the first to N-th step set signals is inputted with a low level and so the set signal SET is inverted to a low level and the reset signal SETB to a high level, the set signal SET and the reset signal SETB are respectively applied to the gates of the third PMOS transistor PMOS3 and the fourth NMOS transistor NMOS4 of the second step clocked inverter 720 to turn on the third PMOS transistor PMOS3 and the fourth NMOS transistor NMOS4, and the low level value of the node N2 is applied to the gates of the fourth PMOS transistor PMOS4 and the third NMOS transistor NMOS3 to turn on only the fourth PMOS transistor PMOS4, and thus a high level is outputted to the node N3.

This output passes through the first inverter INV1 again, so that the node N4 is inverted to a low level, and the signal of the node N5 passing through the third step clocked inverter 730 is inverted to a high level and maintains the high level value. Then, if in order to test the next block of the semiconductor memory device all next bits of the first to N-th step set signals are inputted with a high level, the set signal SET is inverted to a high level, and the reset signal SETB is inverted to a low level. The node N1 is inverted to a low level, and the test control signal TMRS SET passing through the second inverter INV2 is outputted with a high level, whereby the next test mode MRS unit is selected and the test MRS item is applied to the next unit of the semiconductor memory device.

As described above, this exemplary embodiment of the present invention provides the test mode MRS unit which is implemented in the form of the T flip flop to change a level value of the test control signal to a high level and a low level by itself, and the set signal SET and the reset signal SETB are toggled according to values of the first to N-th step set signals without using the discrete set/reset master signal.

In summary, the semiconductor memory device according to an exemplary embodiment of the present invention performs a set/reset of the test mode MRS by only decoding the first to N-th step set signals with minor modifications of the N-step test control signal generating circuit. The semiconductor memory device according to another exemplary embodiment of the present invention changes the set/reset of the individual item by simply toggling the test control signal without using an additional connection line or a separate circuit for performing an additional function.

As described above, the semiconductor memory device of an exemplary embodiment of the present invention can individually perform the test mode MRS reset of each internal blocks of the semiconductor memory device with minor modifications of the conventional N-step test control signal generating circuit or by coding the mode setting signals. Accordingly, it is possible to continuously test the semiconductor memory device without repetitively performing the test mode process of many steps for the re-experimentation, thereby reducing the test time and achieving improved testing convenience.

What is claimed is:

1. A semiconductor memory device, comprising:
    a control signal generator for combining externally supplied command signals to generate a test signal;
    a set/reset signal generator for receiving an externally supplied mode setting signal in response to the test signal and generating a first set/reset signal when the mode setting signal is a signal that designates an individual set/reset;
    a test logic portion for storing and subsequently outputting the mode setting signal in response to the test signal;
    a set/reset master signal generator for receiving the first set/reset signal to output a set/reset master signal for commonly controlling a test mode of internal blocks of the semiconductor memory device; and
    a test control signal generator for processing an output signal of the test logic portion to generate a plurality of control signals and generating a plurality of test control signals as the set/reset master signal in response to the plurality of control signals.

2. The device of claim 1, wherein the test logic portion stores the mode setting signal sequentially applied in response to the test signal and combines the stored mode setting signals to generate a plurality of step set signals when the mode setting signals are completely stored.

3. The device of claim 1, wherein the set/reset signal generator receives the externally supplied mode setting signal in response to the test signal and generates a second set/reset signal when the mode setting signal is a signal that designates a common set/reset.

4. The device of claim 1, further comprising a latch, wherein the set/reset signal generator receives the mode setting signal from the latch which latches the externally supplied mode setting signal in response to the test signal.

5. The device of claim 1, wherein the test logic portion includes
a test mode enable portion for receiving the mode setting signal, the test signal, and a clock signal to generate a test mode enable signal for entering a test mode;
an MRS enable pulse generator for receiving the clock signal and the test mode enable signal to generate a test MRS enable pulse for sequentially enabling a test MRS; and
a plurality of step MRS logic units for receiving the mode setting signal, the test MRS enable pulse signal and the test mode enable signal to output the plurality of step set signals.

6. The device of claim 5, wherein the plurality of step MRS logic units receive the test mode enable signal to enter the test mode and include a plurality of D flip flops for receiving the mode setting signal and the test MRS enable pulse to output the plurality of step set signals.

7. The device of claim 1, wherein the test control signal generator includes a plurality of test mode MRS units that respectively generate the test control signals when a combination of the plurality of step set signals is applied to an input terminal thereof and the second set/reset signal is applied to a control terminal thereof.

8. The device of claim 1, wherein the test control signal generator maintains the test mode of a test target internal block of the semiconductor memory device when a certain test mode MRS unit is selected according to a combination of the plurality of step set signals and when the test control signal maintains a high level, and resets the test mode MRS of the corresponding internal block and finishes the test mode when the test control signal is inverted to a low level.

9. The device of claim 1, wherein the set/reset master signal generator includes
a first inverter for receiving the test mode enable signal to output an inverted value;
a second inverter for receiving the second set/reset signal to output an inverted value;
a first PMOS transistor for performing a switching operation when an output signal of the second inverter is applied to a gate thereof and a power voltage is connected to a source thereof;
a transmission gate in which the test mode enable signal is applied to a gate of an NMOS transistor thereof and an output signal of the first inverter is applied to a gate of a second PMOS transistor thereof;
a third inverter for receiving the first set/reset signal and inverting the first set/reset signal to be outputted to one side of the transmission gate; and
a latch connected to another side of the transmission gate and a drain of the first PMOS transistor and receiving an output signal of the transmission gate and storing data.

10. The device of claim 7, wherein each test mode MRS unit includes
a NAND gate for receiving the plurality of step set signals to output a NAND operation result;
a first inverter for receiving an output signal of the NAND gate to output an inverted value;
a second inverter for receiving the second set/reset signal to output an inverted value;
a first PMOS transistor in which an output signal of the second inverter is applied to a gate thereof and a power voltage is connected to a source thereof;
a transmission gate in which the output signal of the NAND gate is applied to a gate of a second PMOS transistor and an output signal of the first inverter is applied to a gate of an NMOS transistor;
a third inverter for receiving the first set/reset signal, and inverting the first set/reset signal to be outputted to one side of the transmission gate; and
a latch connected to another side of the transmission gate and a drain of the first PMOS transistor, and receiving an output signal of the transmission gate and storing data.

11. The device of claim 10, wherein in the test mode MRS unit,
when the second set/reset signal is initially applied with a high level, the test control signal is applied with a low level, so that a test MRS item is not applied to a corresponding internal block of the semiconductor memory device,
the test control signal is outputted with a high level according to a combination of the plurality of step set signals, so that the test MRS item is applied to the corresponding internal block, and
when the set/reset master signal is applied with a low level for a test of the next block, the test, control signal is outputted with a low level, so that selection of a corresponding test mode MRS unit is released and the test MRS item is not applied.

12. The device of claim 11, wherein the test MRS item is to test a time delay margin or degree of freedom of a data path of an individual internal block of the semiconductor memory device.

13. A semiconductor memory device, comprising:
a control signal generator for combining externally supplied command signals applied to generate a test signal;
a set/reset signal generator for receiving an externally supplied mode setting signal in response to the test signal and generating a first set/reset signal when the mode setting signal is a signal that designates an individual set/reset;
a test logic portion for storing and subsequently outputting the mode setting signal in response to the test signal; and
a test control signal generator for combining an output signal of the test logic portion to generate a plurality of set signals and a plurality of reset signals and generating a plurality of test control signals whose state is changed when a value variation of the mode setting signal is detected, wherein the test logic portion includes
a test mode enable portion for receiving the mode setting signal, the test signal, and a clock signal to generate a test mode enable signal for entering a test mode;

an MRS enable pulse generator for receiving the clock signal and the test mode enable signal to generate a test MRS enable pulse for sequentially enabling a test MRS; and a plurality of step MRS logic units for receiving the mode setting signal, the test MRS enable pulse signal and the test mode enable signal to output the plurality of step set signals.

14. The device of claim 13, wherein the set/reset signal generator receives the mode setting signal to output a set/reset signal, and further comprising a latch, wherein the mode setting signal is applied from the latch which latches externally supplied the mode setting signal in response to the test signal.

15. The device of claim 13, wherein the test logic portion stores the mode setting signal sequentially applied in response to the test signal and combines the stored mode setting signals to generate a plurality of step set signals when the mode setting signals are completely stored.

16. The device of claim 13, wherein the plurality of step MRS logic units receive the test mode enable signal to enter the test mode and include a plurality of D flip flops for receiving the mode setting signal and the test MRS enable pulse to output the plurality of step set signals.

17. The device of claim 13 or claim 14, wherein the test control signal generator includes a plurality of test mode MRS units which respectively output the test control signals when a combination of the plurality of step set signals is applied to an input terminal thereof and the set/reset signal is applied to a control terminal thereof.

18. The device of claim 13, wherein the test control signal generator maintains the test mode of a corresponding test target internal block of the semiconductor memory device when a certain test mode MRS unit is selected according to a combination of the plurality of step set signals and when the test control signal maintains the high level, and resets a test mode MRS of the corresponding internal block and finishes the test mode when the test control signal is converted to a low level.

19. The device of claim 17, wherein the test mode MRS unit includes a NAND gate for receiving the plurality of step set signals and performing a NAND operation to output a reset signal;

a first inverter for receiving an output signal of the NAND gate and inverting the output signal of the NAND gate to output a set signal;

a second inverter for receiving a test MRS reset signal, inverting the test MRS reset signal, and outputting an inverted value of the test MRS reset signal;

a first PMOS transistor for performing a switching operation such that a power voltage is applied to a source thereof and an output signal of the second inverter is applied to a gate thereof;

a first step clocked inverter for receiving an output value of a drain of the first PMOS transistor, inverting the output value of the drain of the first PMOS transistor by control of the reset signal and the set signal, and outputting the inverted output value;

a second step clocked inverter for receiving the inverted output value of the first step clocked inverter, inverting the output value of the first step clocked inverter by control of the reset signal and the set signal, and outputting the inverted outputted value;

a third inverter for receiving and inverting the test MRS reset signal and outputting the inverted test MRS reset signal;

a second PMOS transistor in which the output signal of the second step clocked inverter is applied to a drain thereof, a power voltage is applied to a source thereof, and an output signal of the third inverter is applied to a gate thereof;

a fourth inverter for receiving and inverting the inverted output value of the second step clocked inverter and outputting the inverted output value;

a third step clocked inverter for receiving the inverted output value of the fourth inverter, inverting the output value of the fourth inverter by control of the reset signal and the set signal, and outputting the inverted outputted value;

a fourth step clocked inverter for receiving the inverted output value of the third step clocked inverter, inverting the output value of the third step clocked inverter by control of the reset signal and the set signal, and outputting the inverted outputted value; and a fifth inverter which is connected to the drain of the first PMOS transistor, receives the inverted output value of the fourth step clocked inverter, inverts the inverted output value of the fourth step clocked inverter, and outputs an inverted output signal.

20. The device of claim 19, wherein in the test mode MRS unit, when the set/reset signal is initially applied with a high level, the test control signal is applied with a low level, so that a test MRS item is not applied to a corresponding internal block of the semiconductor memory device, the test control signal is outputted with a high level according to a combination of the plurality of step set signals, so that the test MRS item is applied to the corresponding internal block, and when the set signal is applied with a low level for a test of next block and then transitions to a high level, the test control signal is outputted with a low level, so that selection of a corresponding test mode MRS unit is released and the test MRS item is not applied.

21. The device of claim 20, wherein the test MRS item is a test of a time delay margin or a degree of freedom of a data path of an individual internal block of the semiconductor memory device.

22. The device of claim 20, wherein the test mode MRS unit changes a value of the test control signal by itself to select the corresponding test mode MRS unit and determines whether to apply a test MRS item to a corresponding internal block of the semiconductor memory device.

* * * * *